US009065408B2

(12) United States Patent
Mendenhall et al.

(10) Patent No.: US 9,065,408 B2
(45) Date of Patent: Jun. 23, 2015

(54) VOLTAGE CONTROLLED AMPLIFIER AND METHOD OF USING THE SAME

(71) Applicant: RGB SYSTEMS, INC., Anaheim, CA (US)

(72) Inventors: Eric Mendenhall, Dove Canyon, CA (US); Jared Huntington, Pomona, CA (US)

(73) Assignee: RGB Systems, Inc., Anaheim, CA (US)

( * ) Notice: Subject to any disclaimer, the term of this patent is extended or adjusted under 35 U.S.C. 154(b) by 162 days.

(21) Appl. No.: 13/870,785

(22) Filed: Apr. 25, 2013

(65) Prior Publication Data

US 2014/0266442 A1 Sep. 18, 2014

Related U.S. Application Data

(60) Provisional application No. 61/785,052, filed on Mar. 14, 2013.

(51) Int. Cl.
| | |
|---|---|
| *H03F 3/45* | (2006.01) |
| *H03G 3/00* | (2006.01) |
| *H03G 1/00* | (2006.01) |
| *H03G 3/30* | (2006.01) |
| *H03G 7/00* | (2006.01) |
| *H03F 1/26* | (2006.01) |
| *H03F 1/32* | (2006.01) |

(52) U.S. Cl.
CPC .............. *H03G 3/004* (2013.01); *H03G 1/0005* (2013.01); *H03G 3/3005* (2013.01); *H03G 7/002* (2013.01); *H03F 1/26* (2013.01); *H03F 1/3211* (2013.01); *H03F 3/45076* (2013.01)

(58) Field of Classification Search
USPC .......................................... 330/254, 260, 82
IPC ......................................................... H03F 3/45
See application file for complete search history.

(56) References Cited

U.S. PATENT DOCUMENTS

| | | | |
|---|---|---|---|
| 4,396,891 A | 8/1983 | Johansson et al. | |
| 4,403,199 A * | 9/1983 | Blackmer | 330/278 |
| 4,918,338 A * | 4/1990 | Wong | 327/553 |
| 5,229,720 A | 7/1993 | Nishimura | |
| 7,378,881 B1 | 5/2008 | Opris | |
| 2002/0075073 A1* | 6/2002 | Muza | 330/253 |
| 2003/0234685 A1* | 12/2003 | Ranmuthu | 330/86 |
| 2008/0001661 A1* | 1/2008 | Tachibana et al. | 330/253 |

FOREIGN PATENT DOCUMENTS

EP 0295497 A2 12/1988

OTHER PUBLICATIONS

European Patent Office, Extended European Search Report, Jun. 13, 2014, App. No. EP 14 15 9694.

\* cited by examiner

*Primary Examiner* — Patricia T Nguyen
(74) *Attorney, Agent, or Firm* — The Hecker Law Group, PLC

(57) ABSTRACT

A simplified VCA circuit is presented. The VCA of the present invention uses fewer components and is less complex than prior art OTA-based VCAs. Further, the VCA of the present invention has improved total harmonic distortion (THD) and DC offset characteristics as compared to prior art VCAs. The VCA may be used to prevent clipping with the addition of clipping detection circuitry.

8 Claims, 8 Drawing Sheets

| Attenuation | DC Offset | |
| --- | --- | --- |
| | Prior art VCA | VCA of the present invention |
| -0dB | 3 mV | 1 mV |
| -1dB | 5 mV | -7 mV |
| -2dB | 7 mV | -4 mV |
| -3dB | 9 mV | 0 mV |
| -4dB | 10 mV | -2 mV |
| -5dB | 12 mV | -1 mV |
| -6dB | 13 mV | 4 mV |

VOLTAGE CONTROLLED AMPLIFIER AND METHOD OF USING THE SAME

CROSS-REFERENCE TO RELATED PATENT APPLICATIONS

This patent application claims the benefit of the filing date of U.S. Provisional Patent Application Ser. No. 61/785,052 for "VOLTAGE CONTROLLED AMPLIFIER AND METHOD OF USING THE SAME" filed on Mar. 14, 2013 which is incorporated by reference in its entirety herein.

BACKGROUND OF THE INVENTION (1) Field of the Invention

The present invention relates to a voltage controlled amplifier (VCA) and a method of using the same.

(2) Description of the Related Art

An problem that often occurs in audio amplification is clipping. Clipping occurs when an amplifier is overdriven by high input signal levels and attempts to deliver an output voltage beyond its maximum capability, as shown in FIGS. 1A and 1B. In FIG. 1A, the peaks 102 and troughs 103 of signal 101 are reproduced accurately, so no clipping occurs. In FIG. 1B, the peaks 105 and troughs 106 of signal 104 exceed the maximum output voltage 107 of the amplifier, so the amplitudes of peaks 105 and troughs 106 are clipped to the maximum output voltage 107.

Clipping can be limited with circuitry that detects clipping in an amplifier output signal (using methods well known in the prior art) and reduces the amplitude of the amplifier input signal to a level required to minimize the clipping. Examples of prior art clipping detection and reduction circuits are disclosed in U.S. Pat. Nos. 5,430,409 and 5,453,409. Input signal amplitude reduction may be accomplished with a voltage controlled amplifier (VCA) whose gain is controlled by a voltage signal received from the clip detection circuitry. Examples of prior art VCA's are the PA381 and PA382 dual low noise VCA integrated circuit devices from On-Chip Systems.

A VCA may alternatively be implemented using an Operational Transconductance Amplifier (OTA). An OTA is an amplifier whose differential input voltage produces an output current, which produces an output voltage across a resistive load. The gain (Vout/Vin) is controlled by a gain modifying input current, which can be derived from a control voltage connected across a resistor. Accordingly, an OTA can be used as a VCA. Commercial IC implementations of OTAs include the LM13700 and LM13600 devices from Texas Instruments, which each contain two OTA circuits within a single package. These commercial implementations are relatively large and, because they contain two OTA circuits, are not appropriate for applications where individual OTA circuits are needed.

FIG. 2 is a schematic diagram illustrating an example discrete implementation of a topology of an OTA circuit used in prior art commercial IC devices. The circuit of FIG. 2 includes a positive supply voltage (V+) input 201, a negative supply voltage (V-) input 202, a signal input 203, a signal output 204, ground connections 205, an operational amplifier ("op amp") 206, a bias current input 207, resistors 208, 209, 216, 217, 218 and 219, and five matched transistor pairs 210, 212, 213, 214 and 215.

Gain for the OTA circuit of FIG. 2 is the ratio between signal output 204 and signal input 203, commonly written as $V_o/V_{in}$. The operation of the circuit is that of a normal inverting op amp circuit, where the current flowing through input resistor 208 to summing node 220 is equal to the current flowing through feedback resistor 209. For gain reduction, the current fed to summing node 220 is increased by the OTA circuit, effectively acting as a smaller value of feedback resistor 209, and thereby limiting the gain.

In the implementation of FIG. 2, the non-inverting input (+) of op amp 206 is kept essentially at ground. To achieve gain reduction of an AC input signal, the gain modifying current fed into the inverting (-) input must be bipolar. To produce the bipolar gain modifying current needed at the non-inverting input of op amp 206 requires referencing the bias current input 207 to V- and multiple pairs of matched transistors, resulting in the complexity of the circuit of FIG. 2.

The discrete OTA circuit implementation of FIG. 2, with its five matched pairs of transistors plus the op amp, is not a viable alternative to the prior art commercial OTA IC devices because it would be larger and more expensive than the commercial prior art IC devices. Thus, there is a need for a VCA circuit alternative that is less complex and less expensive than prior art commercial OTA-based VCAs and discrete implementations thereof.

BRIEF SUMMARY OF THE INVENTION

A simplified VCA circuit is presented. The VCA of the present invention uses fewer components and is less complex than prior art OTA-based VCAs. Further, the VCA of the present invention has improved total harmonic distortion (THD) and DC offset characteristics as compared to prior art VCAs. The VCA may be used to prevent clipping with the addition of clipping detection circuitry.

BRIEF DESCRIPTION OF THE DRAWINGS

The present invention may be better understood, and its features made apparent to those skilled in the art by referencing the accompanying drawings.

FIG. 7 is a table showing the attenuation versus DC offset figures of an embodiment of the present invention.

The use of the same reference symbols in different drawings indicates similar or identical items.

DETAILED DESCRIPTION OF THE INVENTION

A novel voltage-controlled amplifier (VCA) circuit is presented. In one or more embodiments, the present invention comprises a novel differential op amp configuration that reduces the number of transistors from five matched pairs used in prior art implementations to a single pair, which need not be a matched pair. In one or more embodiments, the VCA of the present invention exhibits improved total harmonic distortion (THD) and DC offset characteristics as compared to prior art OTA-based VCAs.

Figure 1A:
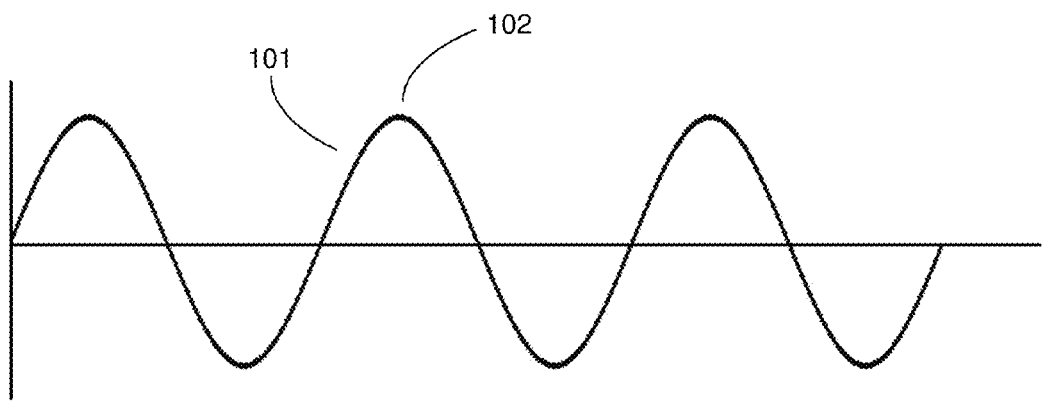
FIG. 1A is a diagram of a sine wave that does not exhibit clipping.
Figure 1B:
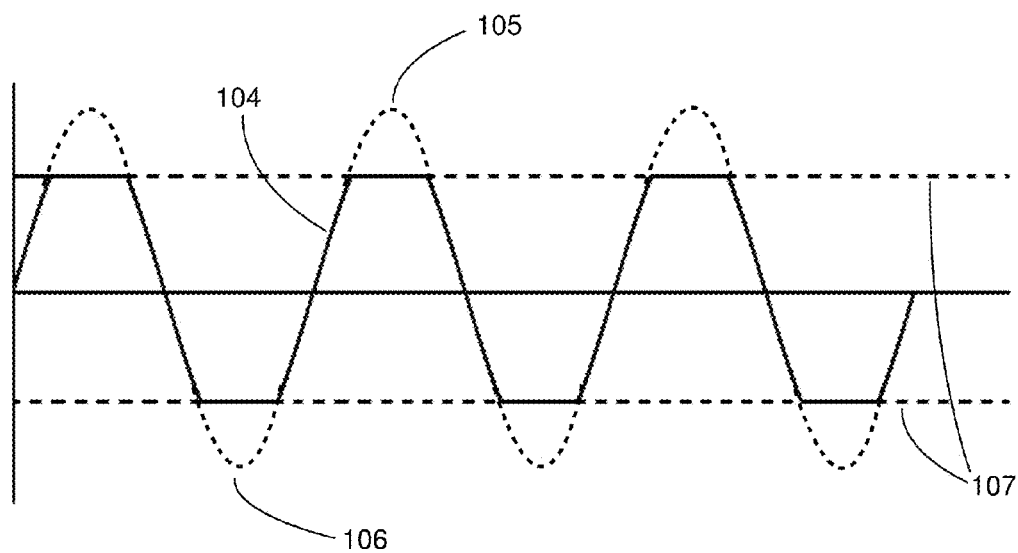
FIG. 1B is a diagram of a sine wave that exhibits clipping of the peaks and troughs.
Figure 2:
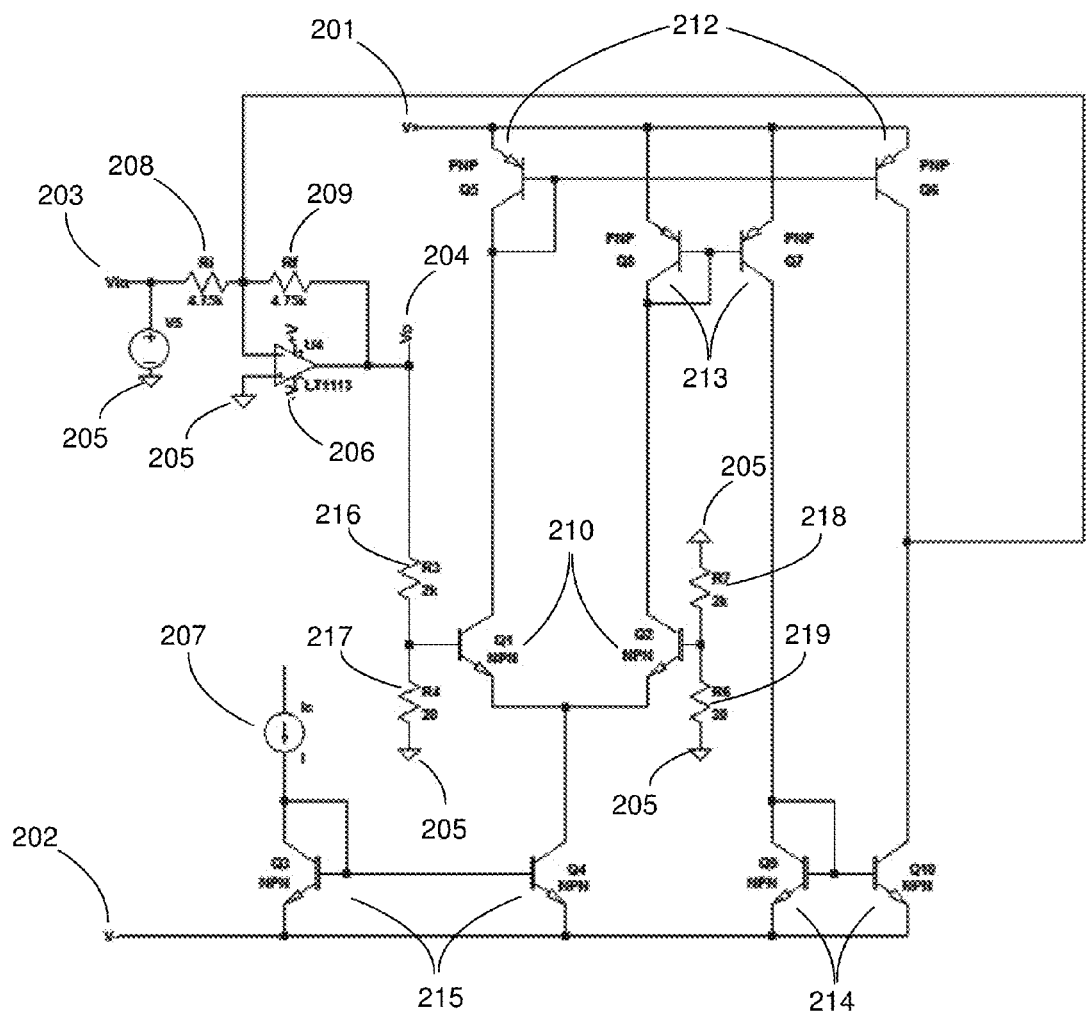
FIG. 2 is a schematic diagram illustrating an example of a prior art OTA circuit topology.
Figure 3:
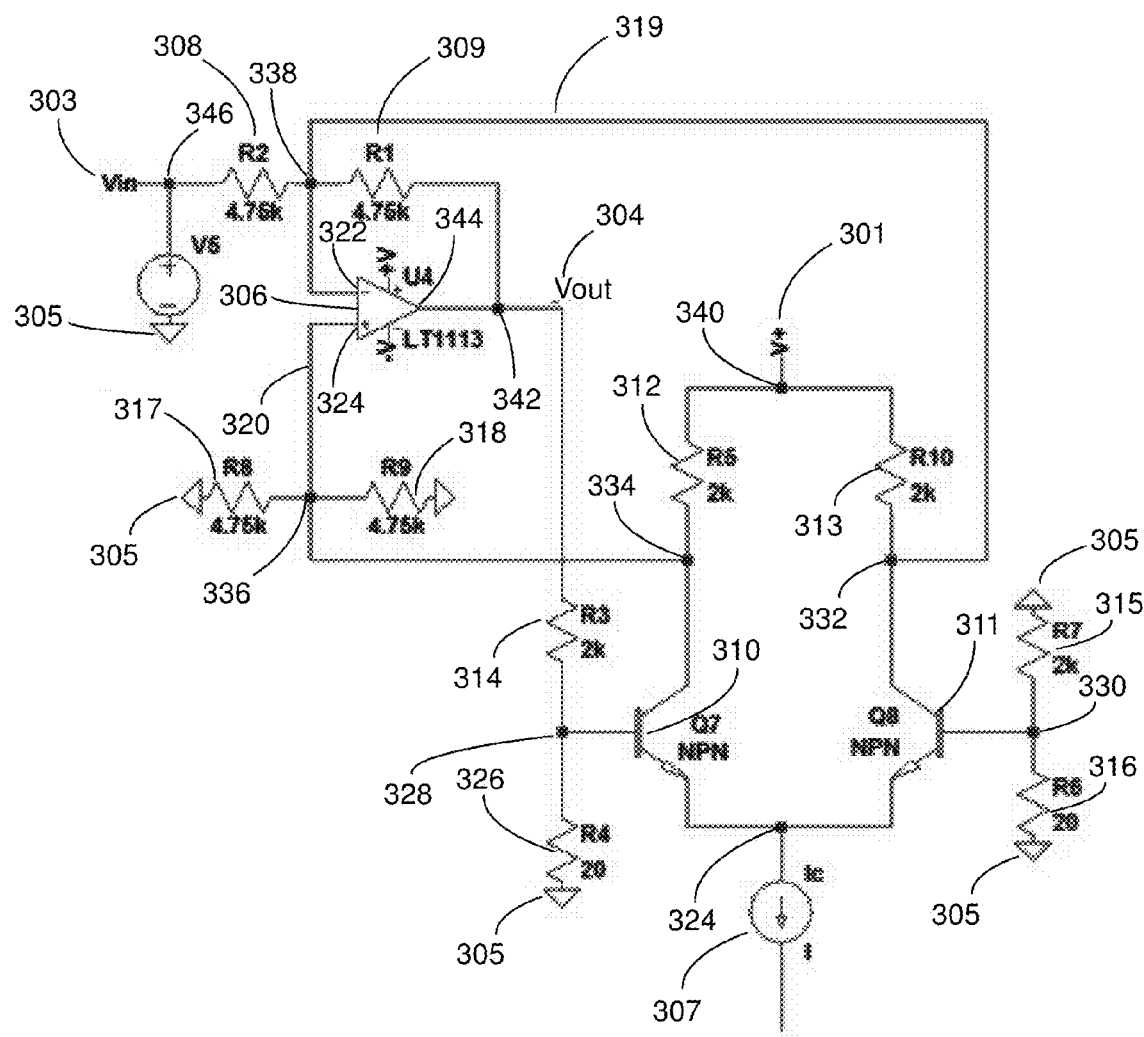
FIG. 3 is a schematic diagram illustrating an embodiment of the present invention.

FIG. 3 shows an embodiment of a VCA circuit of the present invention. In the VCA circuit of FIG. 3, op amp 306 is configured as a differential amplifier, as opposed to being configured as an inverting amplifier as in the prior art implementation of FIG. 2. Instead of requiring a bipolar gain controlling current as in the prior art, the VCA circuit of FIG. 3 uses a unipolar gain controlling current that is fed via connections 319 and 320 into the inverting and non-inverting inputs 322 and 324, respectively, of op amp 306. The gain controlling current is derived from input current 307 via a single pair of transistors 310 and 311, which may, but need not be, a matched pair.

In the embodiment of FIG. 3, input control current 307 is connected to node 324, which is also connected to the emitters of transistors 310 and 311. The base of transistor 311 is connected to node 330. Resistors 315 and 316 are connected between node 330 and ground 305. The base of transistor 310 is connected to node 328. Resistor 326 is connected between node 328 and ground 305. Resistor 314 is connected between node 328 and node 304, from which the output signal $V_O$ is obtained. The collector of transistor 311 is connected to node 332, while the collector of transistor 310 is connected to node 334. Node 332 is connected via connection 319 to node 338. Node 334 is connected to node 336. Resistor 312 is connected between node 334 and node 340, which is connected to positive voltage supply $V_+$ 301. Resistor 313 is connected between node 332 and node 340. Resistors 317 and 318 are connected between node 336 and ground 305. Node 336 is connected to non-inverting input 324 of op amp 306. Node 342 is connected to output 344 of op amp 306. Node 338 is connected to inverting input 322 of op amp 306. Resistor 309 is connected between node 338 and node 342. Resistor 308 is connected between node 338 and node 346. Input signal $V_{in}$ 303 is connected between node 346 and ground 305.

In the circuit of FIG. 3, unipolar control current 307 is fed into both the inverting and non inverting inputs 322 and 324 of op amp 306, thereby controlling the gain applied by op amp 306 to input signal $V_{in}$ 303. The circuit of FIG. 3 thus operates as a VCA. As compared to the OTA VCA of FIG. 2, the circuit of FIG. 3 is less complex and less costly, requiring only a single pair of (not necessarily matched) transistors as opposed to the five matched pairs required by the VCA of FIG. 2.

Figure 4:
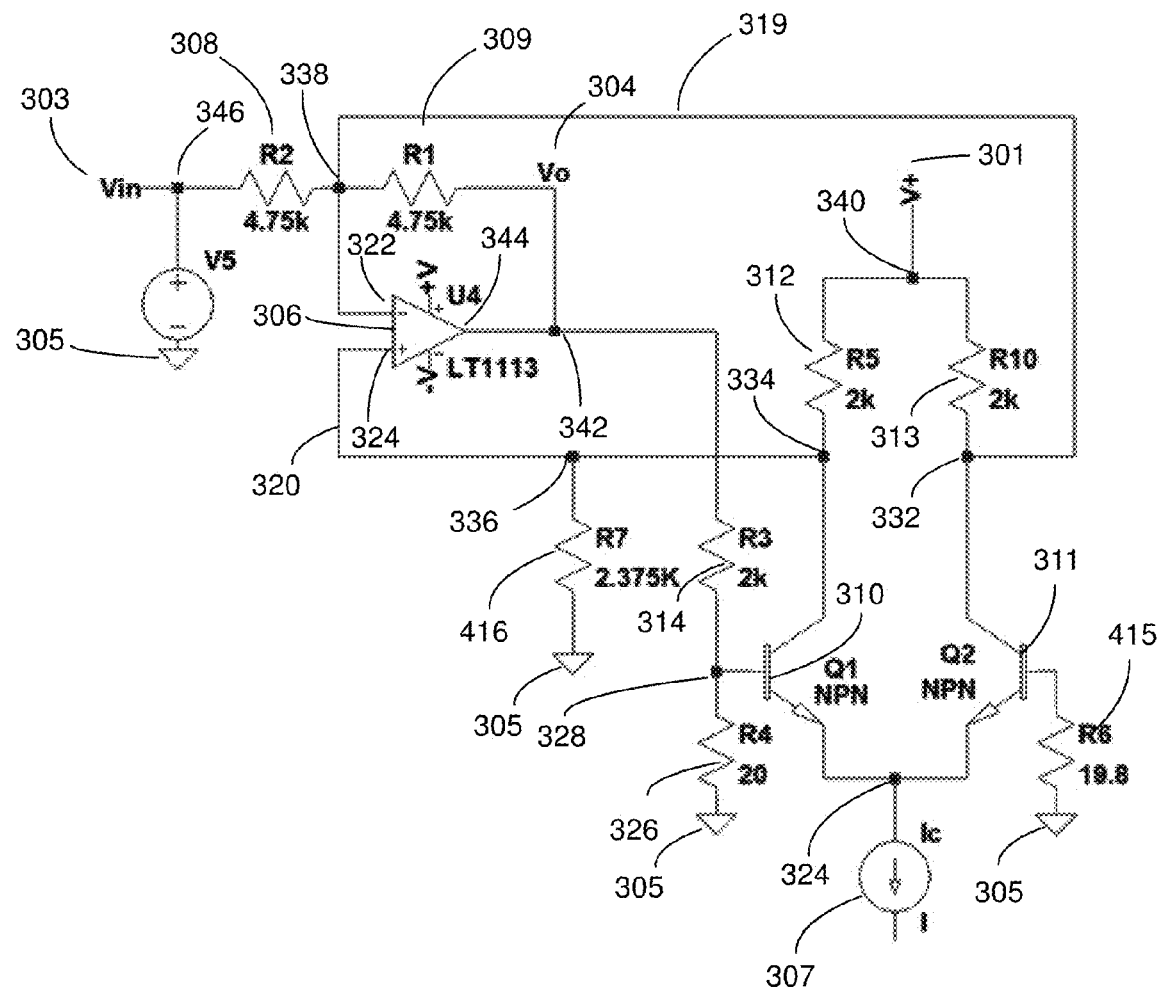
FIG. 4 is a schematic diagram illustrating an embodiment of the present invention.

FIG. 4 shows an embodiment of the VCA of the invention that is a further simplification of the embodiment of FIG. 3. In the embodiment of FIG. 4, resistors 315 and 316 have been replaced by equivalent single resistor 415, and resistors 317 and 318 have been replaced by equivalent single resistor 416. Otherwise, the circuits of FIGS. 3 and 4 are the same.

Figure 5:
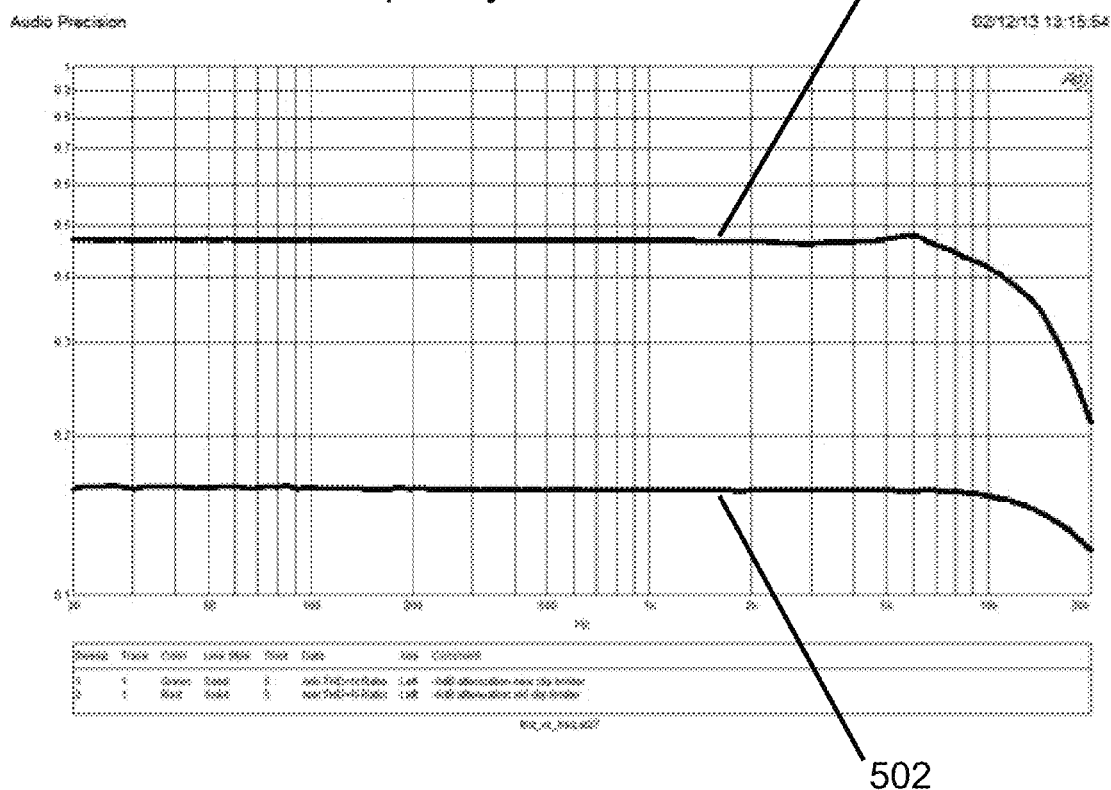
FIG. 5 is a graph showing the total harmonic distortion (THD) plus noise versus frequency curves of an embodiment of the present invention.

FIG. 5 is a graph showing the total harmonic distortion plus noise (THD+N) versus frequency curves of an embodiment of the present invention. The horizontal axis of the graph of FIG. 5 measures frequency and spans the range from 20 Hz to 20 kHz and uses a logarithmic scale. The vertical axis of the graph of FIG. 5 measures THD+N and spans the range from 0.1 to 1.0 and uses a logarithmic scale. In FIG. 5, THD+N is expressed as the ratio of the sum of the powers of all harmonic components, plus the noise power, to the power of the fundamental frequency. Curve 501 represents the THD+N measurements for a prior art VCA like the one shown in FIG. 2. Curve 502 represents the THD+N measurements of one or more embodiments of the present invention. The graph shows that one or more embodiments of the present invention have a lower THD+N, across the entire frequency range, than the THD+N of the prior art VCA. Further, the graph shows that the THD+N of one or more embodiments is flatter and more uniform across the entire frequency range than the THD+N of the prior art VCA.

Figure 6:
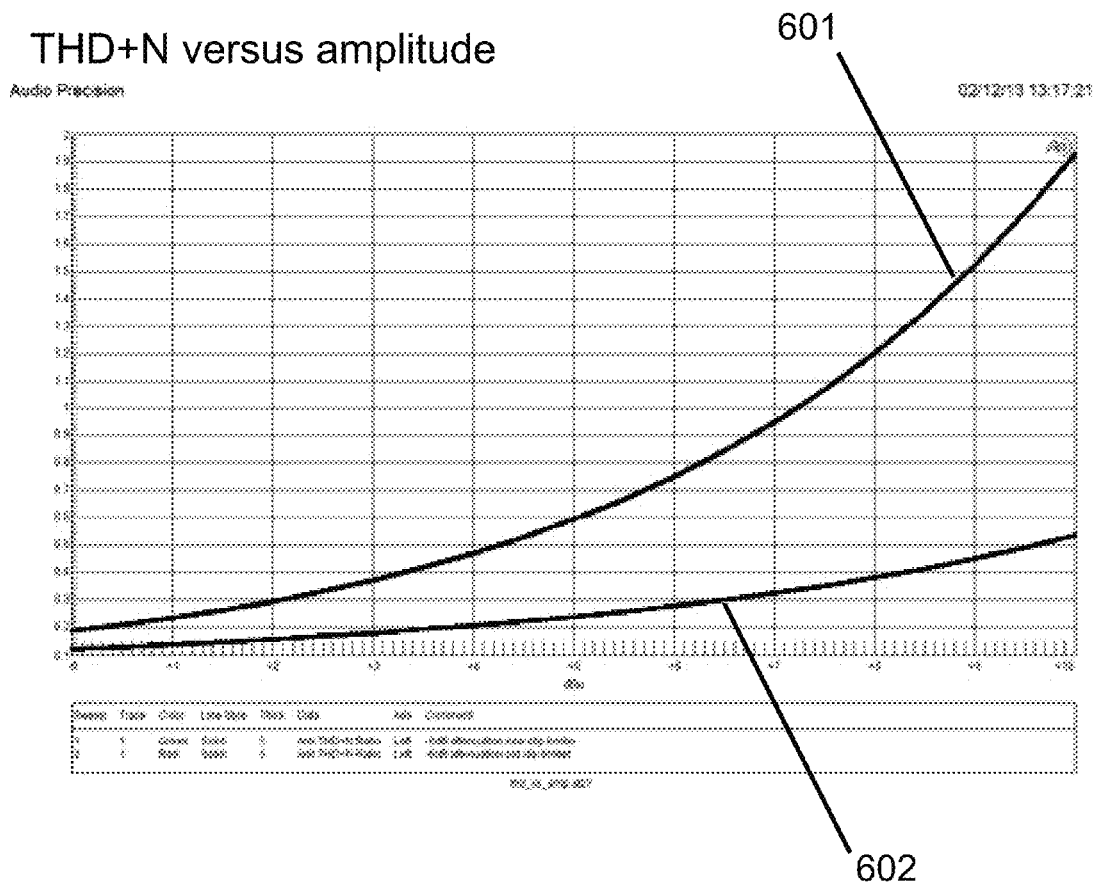
FIG. 6 is a graph showing the total harmonic distortion (THD) plus noise versus amplitude curves of an embodiment of the present invention.

FIG. 6 is a graph showing the total harmonic distortion plus noise (THD+N) versus amplitude curves of an embodiment of the present invention. The horizontal axis of the graph of FIG. 6 measures amplitude and spans the range from 0 dB to +10 dB and uses a linear scale. The vertical axis of the graph of FIG. 6 measures THD+N and spans the range from 0.1 to 2.0 and uses a logarithmic scale. In FIG. 6, THD+N is expressed as the ratio of the sum of the powers of all harmonic components, plus the noise power, to the power of the fundamental frequency. Curve 601 represents the THD+N measurements for a prior art VCA like the one shown in FIG. 2. Curve 602 represents the THD+N measurements of one or more embodiments of the present invention. The graph shows that one or more embodiments of the present invention have a lower THD+N, across the entire amplitude range, than the THD+N of the prior art VCA. Further, the graph shows that the THD+N of one or more embodiments is flatter and more uniform across the entire amplitude range than the THD+N of the prior art VCA.

FIG. 7 is a table showing the attenuation versus DC offset figures of an embodiment of the present invention. The table shows that one or more embodiments of the present invention have an overall lower, flatter, and more uniform DC offset, across the entire attenuation range, than the DC offset of the prior art VCA. Further, the table shows that the DC offset of one or more embodiments is centered about 0, unlike the DC offset of the prior art VCA, which increases approximately linearly with increasing attenuation.

Figure 8:
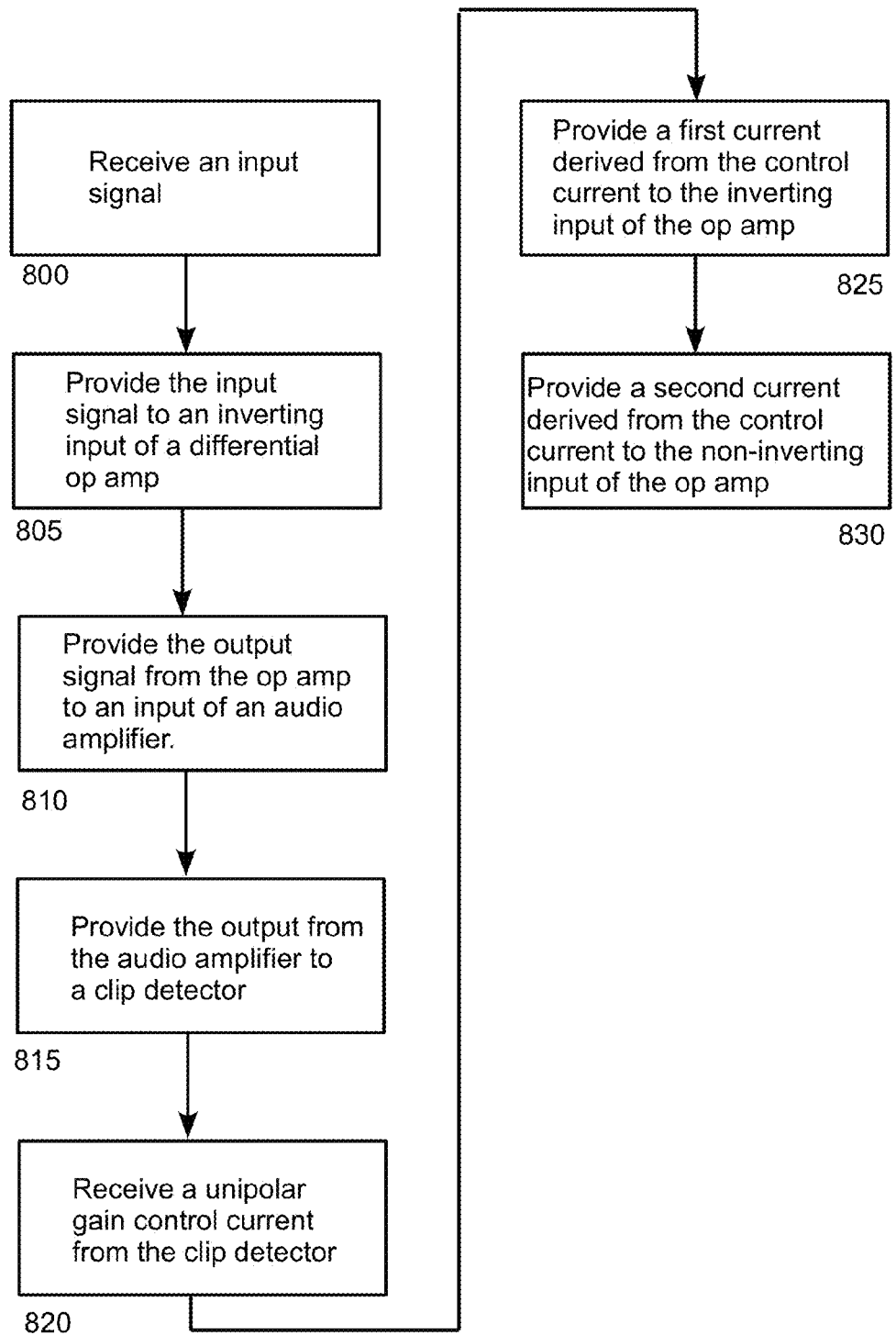
FIG. 8 is a flow chart illustrating a method for controlling reducing clipping in accordance with at least one embodiment of the invention.

FIG. 8 is a flow chart illustrating a method for reducing clipping according to an embodiment of the invention. The method begins in step 800, where an input signal is received. At step 805, the input signal is provided to the inverting input of an op amp that is configured as a differential amplifier. At step 810, the output signal from the op amp is provided to the input of an audio amplifier. At step 815, the output from the audio amplifier is provided to a clip detector. At step 820, a unipolar gain control current is received from the clip detector. At step 825, a first current derived from the gain control current is provided to the inverting input of the op amp. At step 830, a second current derived from the gain control current is provided to the non-inverting input of the op amp.

Thus, a novel voltage-controlled amplifier (VCA) and a method of using the same to reduce clipping is presented. Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for reducing clipping in an audio amplifier comprising:
   receiving an input signal at a voltage controlled amplifier;
   providing the input signal to an inverting input of an operational amplifier;
   providing a first output signal from said operational amplifier to said audio amplifier;
   providing a second output signal from said audio amplifier to a clip detector;
   receiving a unipolar current signal from said clip detector at said voltage controlled amplifier;

providing a first current derived from said current signal to said inverting input of said operational amplifier;

providing a second current derived from said current signal to a non-inverting input of said operational amplifier.

2. The method of claim 1 further comprising the step of configuring said operational amplifier as a differential operational amplifier.

3. The method of claim 1 wherein said step of providing said first current derived from said current signal to said inverting input of said operational amplifier comprises deriving said first current using a single pair of transistors.

4. The method of claim 1 wherein said step of providing said second current derived from said current signal to said non-inverting input of said operational amplifier comprises deriving said first current using a single pair of transistors.

5. The method of claim 3 wherein said step of providing said second current derived from said current signal to said non-inverting input of said operational amplifier comprises deriving said first current using said single pair of transistors.

6. The method of claim 3 wherein said step of providing said first current derived from said current signal to said inverting input of said operational amplifier comprises deriving said first current using a single pair of unmatched transistors.

7. The method of claim 4 wherein said step of providing said second current derived from said current signal to said non-inverting input of said operational amplifier comprises deriving said first current using a single pair of unmatched transistors.

8. The method of claim 7 wherein said step of providing said second current derived from said current signal to said non-inverting input of said operational amplifier comprises deriving said first current using said single pair of unmatched transistors.

* * * * *